United States Patent
Vashchenko et al.

(10) Patent No.: US 7,714,355 B1
(45) Date of Patent: May 11, 2010

(54) METHOD OF CONTROLLING THE BREAKDOWN VOLTAGE OF BSCRS AND BJT CLAMPS

(75) Inventors: Vladislav Vashchenko, Palo Alto, CA (US); Alexei Sadovnikov, Sunnyvale, CA (US); Peter J. Hopper, San Jose, CA (US); Andy Strachan, Sunnyvale, CA (US)

(73) Assignee: National Semiconductor Corp, Santa Clara, CA (US)

( * ) Notice: Subject to any disclaimer, the term of this patent is extended or adjusted under 35 U.S.C. 154(b) by 760 days.

(21) Appl. No.: 11/312,704

(22) Filed: Dec. 20, 2005

(51) Int. Cl.
*H01L 29/74* (2006.01)

(52) U.S. Cl. .................. 257/173; 257/170; 257/175; 257/189; 257/235; 257/309; 257/312; 257/331; 257/342

(58) Field of Classification Search ................ 257/170, 257/189, 202, 204, 234, 235, 309, 312, 314, 257/326, 331, 342, 173, 175
See application file for complete search history.

(56) References Cited

U.S. PATENT DOCUMENTS

| | | | |
|---|---|---|---|
| 5,537,015 A * | 7/1996 | Karwath | 318/400.29 |
| 6,225,664 B1 * | 5/2001 | Endo et al. | 257/347 |
| 6,541,801 B1 * | 4/2003 | Vashchenko et al. | 257/119 |
| 6,559,507 B1 * | 5/2003 | Vashchenko et al. | 257/356 |
| 6,586,317 B1 * | 7/2003 | Vashchenko et al. | 438/510 |
| 6,822,294 B1 * | 11/2004 | Vashchenko et al. | 257/355 |
| 6,946,690 B1 * | 9/2005 | Vashchenko et al. | 257/133 |
| 7,193,271 B2 * | 3/2007 | Lee et al. | 257/330 |
| 2003/0052721 A1 * | 3/2003 | Chaudhry et al. | 327/242 |
| 2006/0011985 A1 * | 1/2006 | Cai et al. | 257/369 |

* cited by examiner

*Primary Examiner*—N Drew Richards
*Assistant Examiner*—Joannie A Garcia
(74) *Attorney, Agent, or Firm*—Jurgen K. Vollrath

(57) ABSTRACT

In a BSCR or BJT ESD clamp, the breakdown voltage and DC voltage tolerance are controlled by controlling the size of the collector of the BJT device by masking part of the collector.

3 Claims, 2 Drawing Sheets

METHOD OF CONTROLLING THE BREAKDOWN VOLTAGE OF BSCRS AND BJT CLAMPS

FIELD OF THE INVENTION

The invention relates to BSCR and BJT clamps. In particular it relates to the breakdown voltage of such clamps.

BACKGROUND OF THE INVENTION

Bipolar junction devices such as bipolar SCRs (BSCRs) and BJTs as electrostatic discharge (ESD) protection structures experience difficulties when required for high speed output circuits, since in the case of high frequency bipolar structures the subcollector is typically heavily doped in order to provide the requisite short rise times. In fact the rise time may be comparable or even smaller than the typical rise time of an electrostatic discharge (ESD) pulse. Thus dynamic coupling cannot be used to turn on the device since the sensitivity of the device to dV/dt results in the device either having too low a turn-on voltage during normal operation or too high a turn-on voltage during ESD events. Therefore the few available DC breakdown blocking junctions that are currently available in supported devices do not adequately accommodate different breakdown voltage requirements.

What is needed is a way of tailoring the breakdown voltage to the specific needs.

SUMMARY OF THE INVENTION

The present invention relies on avalanche breakdown rather than dynamic coupling to control the breakdown voltage of the BJT or BSCR device. This is done by effectively increasing the distance between the BJT emitter and collector, thereby increasing the voltage that is required to sweep carriers across the junction provided by the p-material between the collector and the emitter of the BJT structure.

According to the invention, there is provided a method of controlling the breakdown voltage of a BJT or of a BSCR device, which includes an npn bipolar structure with an n-emitter, a p-base, and an n-collector, comprising determining the desired breakdown voltage, selecting a blocking mask for partially blocking the n-collector by an amount that will provide the desired breakdown voltage, and partially blocking the n-collector using the mask. The n-collector is preferably blocked under the n-emitter p-base region. In the case of device formed in a p-epitaxial layer, the result of blocking the n-collector is an increase in the amount of p-epi material lying between the p-base and the collector. The method may further comprise offsetting the p-base doping. For purposes of this application, the use of the term "collector" or "n-collector" when discussing blocking, includes also the sub-collector comprising an n-buried layer (NBL) and n-sinker.

Further, according to the invention, there is provided a method of controlling the DC voltage tolerance of a BJT or of a BSCR device, which includes an npn bipolar structure with an n-emitter, a p-base, and an n-collector (which includes a subcollector), comprising partially blocking the n-collector during formation of the of the bipolar structure.

Still further, according to the invention, there is provided a method of controlling the breakdown voltage of a BJT or of a BSCR device, which includes an npn bipolar structure with an n-emitter, a p-base, and an n-collector having a subcollector, comprising reducing the number of charge carriers available for avalanche multiplication from the n-collector. The method may further include reducing the number of charge carriers available from the p-base. The reduction in carriers preferably comprises eliminating at least part of the n-collector, e.g., by blocking at least part of the collector during its formation.

DETAILED DESCRIPTION OF THE INVENTION

Figure 1:
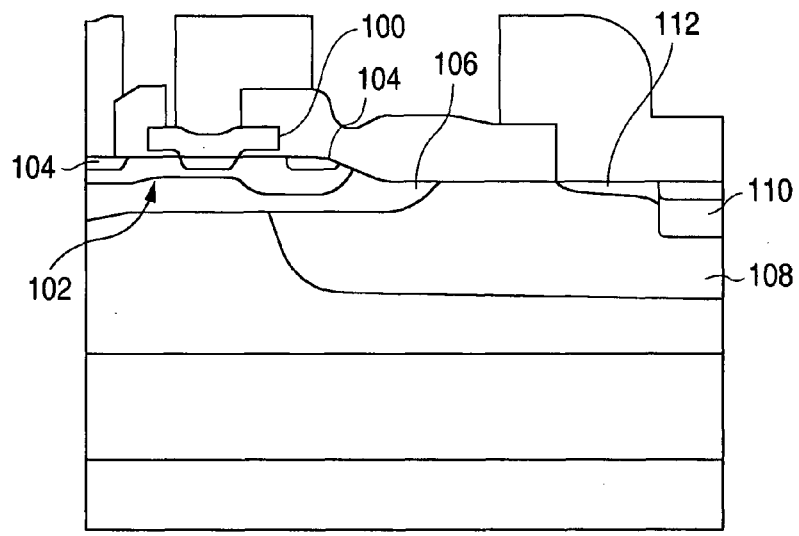
FIG. 1 shows a cross section through a prior art BSCR.

A typical prior art BSCR with its vertical npn bipolar junction transistor (BJT) structure is shown in cross section in FIG. 1. The BSCR includes an n-polysilicon emitter 100 formed on a p-base 102 having external p+bases 104, and an n-epitaxially grown collector 106 with subcollector in the form of an n-buried layer (NBL) 108 contacted through an n-sinker 110. The BSCR also includes a p+ region 112.

Figure 2:
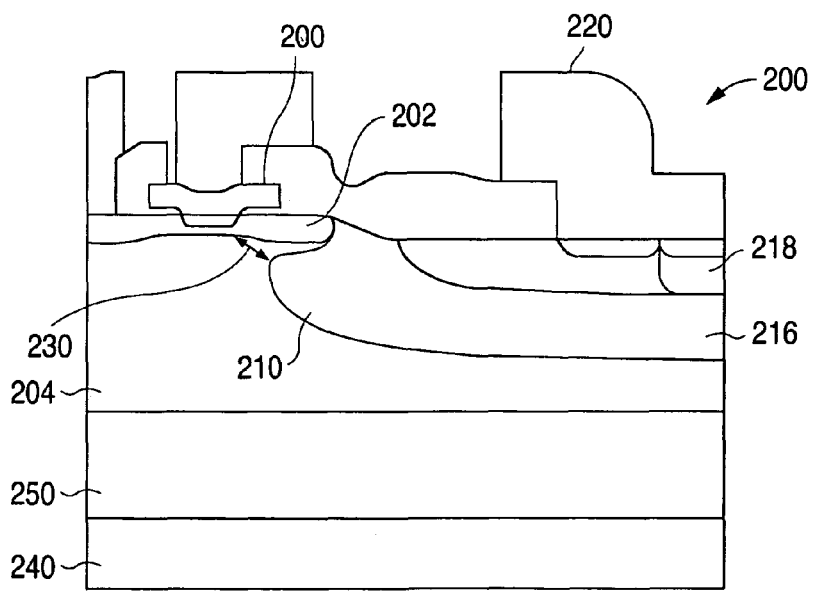
FIG. 2 shows a cross section through one embodiment of an npn bipolar device of the invention.

In contrast, the present invention proposes making some changes to the prior art BJT and BSCR devices. One embodiment of an npn bipolar junction transistor (BJT) with controlled breakdown is shown in FIG. 2. The BJT device 200 includes an n-poly emitter 200 formed on a p-base with p+ external bases 202. The device 200 is formed in a p-epitaxial layer 204, thus the base with its external bases 202 is also formed in the epi layer 204. As shown in FIG. 2, the collector of the device (indicated generally by reference numeral 210) includes a sub-collector in the form of an n-buried layer 216 connected through an n-sinker 218 to a collector contact 220. However part of the p-collector (which for this discussion includes the sub-collector) below the emitter 200 and below part of the right hand portion of the external base 202 has been eliminated by blocking the collector during formation through the use of a mask (not shown). The result is that the amount of collector/sub-collector has been reduced thereby reducing the number of charge carriers it can contribute during avalanche multiplication. Seen another way, the distance between the emitter 200 and collector 210 has been increased by blocking part of the collector 210. This is indicated by reference numeral 230. As shown in FIG. 2, the entire device is formed in a p-substrate 240, and the epitaxial layer 204 is grown on an n-buried layer (NBL) 250.

Figure 3:
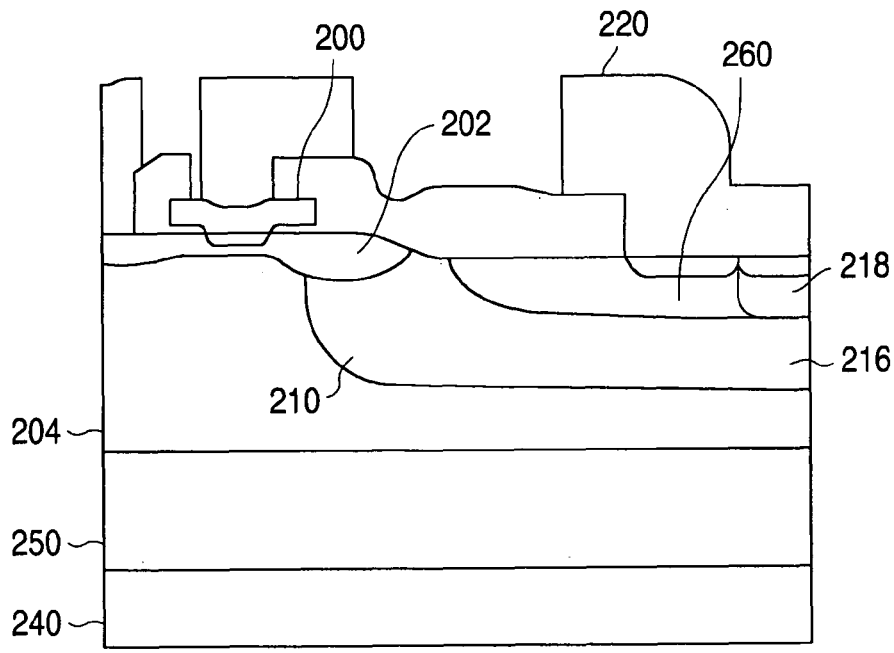
FIG. 3 shows a cross section through one embodiment of BSCR device of the invention.

FIG. 3 shows one embodiment of a BSCR of the invention. Since the BSCR 300 is similar to the BJT 200, similar structural elements have been depicted by the same reference numerals. In addition to the emitter 200, base with external bases 202, and collector 210 with its sub-collector 216, 218, the BSCR includes a p-type region 310, thereby defining an npnp structure with the n-collector, p-epi/p-base and n-emitter. As shown in FIG. 3, The p-type region 310 and the n-sinker 218 are formed in an n-well 260. Again, the collector 210 has been partially blocked to leave an enlarged p-region, in the form of the p-epi region 204 between the remaining collector 210 and the emitter 200.

Figure 4:
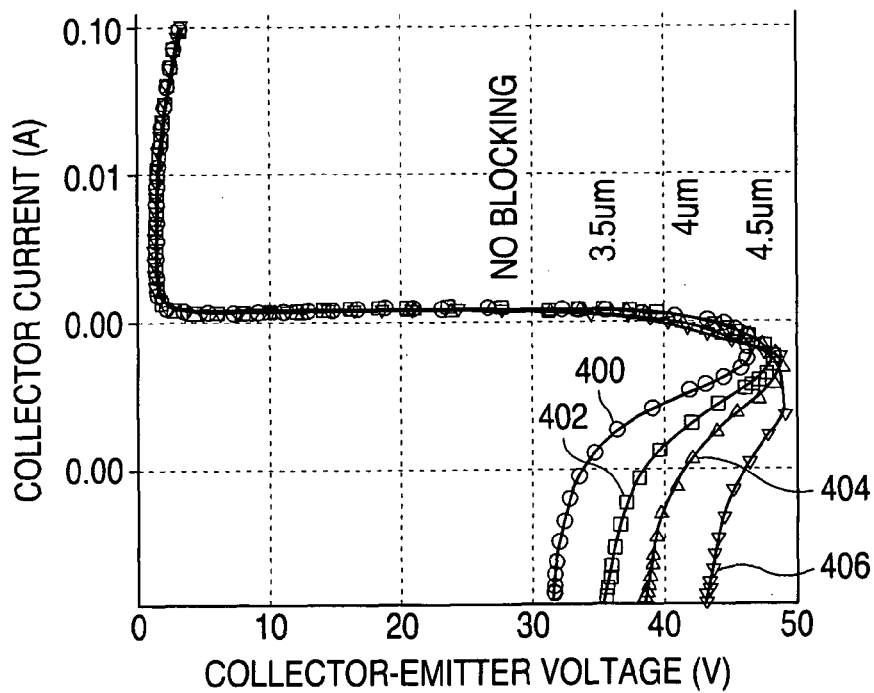
FIG. 4 shows collector current versus collector-emitter voltage curves for various collector blocking distances.

The effect of the blocking of the collector is shown in FIG. 4, which shows the increasing breakdown voltages for increasing blocking distances from no blocking (curve 400), through 3.5 μm blocking (curve 402), and 4 μm (curve 404), to 4.5 μm blocking (curve 406).

In addition to selectively blocking the collector in order to achieve the desired breakdown voltage or the desired DC voltage tolerance, the present invention also proposes offsetting the p-base size to account for the reduced number of charge carriers provided by the collector due to the collector having been reduced in size.

While the invention has been described with respect to two specific embodiments, it will be appreciated that the invention is not limited to these embodiments but includes other configurations falling within the scope of the claims.

What is claimed is:

1. A method of controlling a BJT or BSCR device's DC voltage tolerance, which device includes an npn bipolar structure with an n-emitter, a p-base, and an n-collector, comprising defining the DC voltage tolerance for a particular application, selecting a blocking mask for partially blocking the n-collector during formation of the bipolar structure by an amount that will provide said defined DC voltage tolerance, and partially blocking the n-collector using the mask.

2. A method of claim 1, wherein the n-collector is blocked so as to space the n-collector by a distance of 0 to 4.5 μm from the p-base.

3. A method of claim 2, further comprising offsetting the p-base doping or reducing the size of the p-base.

* * * * *